United States Patent
Jin et al.

(10) Patent No.: US 6,204,790 B1
(45) Date of Patent: Mar. 20, 2001

(54) STACKED DIGITAL-TO-ANALOG CONVERTER AND METHODS OF PERFORMING DIGITAL-TO-ANALOG CONVERSION

(75) Inventors: Hang Jin, Plano, TX (US); Koon H. Teo, Nepean (CA)

(73) Assignee: Nortel Networks Limited, Montreal (CA)

( * ) Notice: Subject to any disclaimer, the term of this patent is extended or adjusted under 35 U.S.C. 154(b) by 0 days.

(21) Appl. No.: 09/328,591

(22) Filed: Jun. 10, 1999

(51) Int. Cl.[7] .................................................. H03M 1/66
(52) U.S. Cl. ............................................................ 341/145
(58) Field of Search .................................. 341/145, 133, 341/155, 172, 144, 118, 146

(56) References Cited

U.S. PATENT DOCUMENTS

| | | | |
|---|---|---|---|
| 4,198,622 | 4/1980 | Connolly, Jr. et al. | 340/347 |
| 4,746,903 | 5/1988 | Czarniak et al. | 340/347 |
| 5,294,927 | 3/1994 | Levinson et al. | 341/141 |
| 5,894,497 | * 4/1999 | Overton | 341/133 |
| 6,097,324 | * 8/2000 | Myer et al. | 341/118 |

* cited by examiner

*Primary Examiner*—Brian Young

(57) ABSTRACT

An apparatus for performing digital-to-analog conversion with an increased SFDR is provided. An incoming M-bit sample is split into first and second N-bit samples. Preferably, M=16, and N=12. The first N-bit sample contains information relating to the M-bit sample when outside a first predetermined range, and the second N-bit sample contains information relating to the M-bit sample when inside said first predetermined range. A first DAC processes the first N-bit sample to produce a first analog signal, and a second DAC for processing the second N-bit sample to produce a second analog signal. An attenuator attenuates the second analog signal to produce a third analog signal. Finally, a summer is provided adding the first analog signal to the third analog signal representative of the M-bit sample. Preferably, the second predetermined range is a range having a size equal to the range of the second N-bit DAC which is centered at the midpoint of the range the M-bit sample. Advantageously, most transitions in the signal occur in the second analog signal, and as such there is more noise in the second analog signal. However, the second analog signal is the signal which is attenuated, and this attenuation also attenuates the noise. Thus, when the two analog signals are combined, a lower overall noise level results. The result is a digital-to-analog converter apparatus which is suitable for wideband applications which require large SFDR.

20 Claims, 4 Drawing Sheets

STACKED DIGITAL-TO-ANALOG CONVERTER AND METHODS OF PERFORMING DIGITAL-TO-ANALOG CONVERSION

FIELD OF THE INVENTION

The invention relates to digital-to-analog converters, and to methods of performing digital-to-analog conversion.

BACKGROUND OF THE INVENTION

Some digital-to-analog converters (DAC) take baseband digital samples and convert them to an IF (intermediate frequency) analog signal. The particular IF is determined by the frequency of a clock applied to the DAC. The spectrum of the analog signal is centred at the intermediate frequency, and typically drops off on either side of the intermediate frequency. All DACs introduce an interference effect known as spurs. These are spikes in the frequency domain representation of the converted signal which are caused by the design of the DAC, and may be a function of the clock, and certain input signal characteristics for example. While the maximum meaningful output of a DAC is determined by the number of bits in the DAC, the minimum is determined by the magnitude of the spurs. The SFDR (spurious free dynamic range) of the DAC is the maximum meaningful output minus the maximum spur magnitude, this representing the range of signal magnitudes to which the spurs contribute negligibly. It is a characteristic of existing DACs that the SFDR decreases with increasing frequency, and this limits the maximum frequency for which a given DAC will be useful. One result of this is that state of the art DACs do not have a sufficient SFDR for wideband/multi-carrier next generation wireless systems.

SUMMARY OF THE INVENTION

It is an object of the invention to obviate or mitigate one or more of the above identified disadvantages.

An apparatus for performing digital-to-analog conversion with an increased SFDR is provided. An incoming M-bit sample is split into first and second N-bit samples. Preferably, M=16, and N=12. The first N-bit sample contains information relating to the M-bit sample when outside a first predetermined range, and the second N-bit sample contains information relating to the M-bit sample when inside the first predetermined range. A first DAC processes the first N-bit sample to produce a first analog signal, and a second DAC for processing the second N-bit sample to produce a second analog signal. An attenuator attenuates the second analog signal to produce a third analog signal. Finally, a summer is provided for adding the first analog signal to the third analog signal representative of the M-bit sample. Preferably, the second predetermined range is a range having a size equal to the range of the second N-bit DAC which is centred at the midpoint of the range the M-bit sample.

Advantageously, most transitions in the signal occur in the second analog signal, and as such there is more noise in the second analog signal. However, the second analog signal is the signal which is attenuated, and this attenuation also attenuates the noise in the second analog signal. Thus, when the two analog signals are combined, a lower overall noise level results. The result is a digital-to-analog converter apparatus which is suitable for wideband applications which require large SFDR.

BRIEF DESCRIPTION OF THE DRAWINGS

Preferred embodiments of the invention will now be described with reference to the attached drawings in which.

DETAILED DESCRIPTION OF THE PREFERRED EMBODIMENTS

Figure 1:
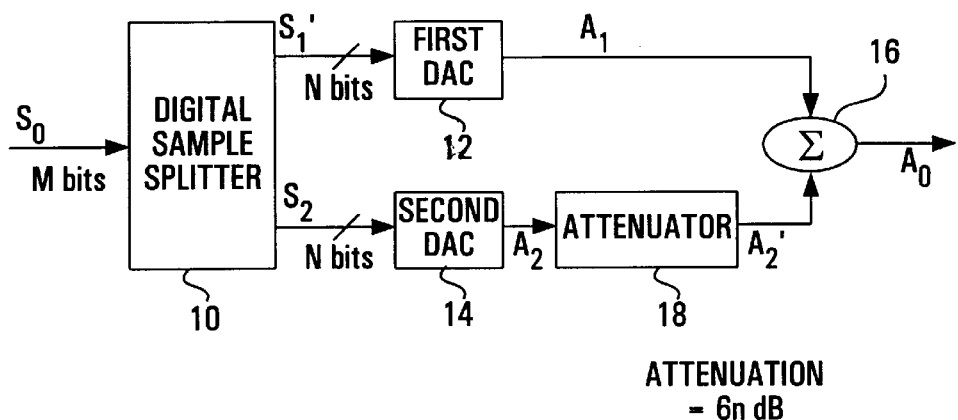
FIG. 1 is a block diagram of a stacked digital-to-analog converter apparatus according to an embodiment of the invention.

Referring now to FIG. 1, a stacked DAC according to an embodiment of the invention comprises a digital sample splitter 10 having outputs connected to a first DAC 12 a second DAC 14. The first DAC 12 has an output connected to a summer 16. The second DAC 14 has an output which is connected to an attenuator 18 which in turn has an output which is connected to the summer 16. The summer 16 produces the DAC's overall result.

The digital sample splitter 10 receives an input signal $S_0$ which consists of M-bit digital samples, either parallel or serial. The digital sample splitter 10 performs some manipulation of the M-bit digital samples, the details of this manipulation being provided below, and produces two output signals $S_1'$ and $S_2$ each of which are N-bit digital words, where N<M. The first DAC 12 is a conventional N-bit DAC which converts the N-bit samples of $S_1'$ into a first analog signal $A_1$. Similarly, the second DAC 14 is a conventional N-bit DAC which converts the N-bit samples of $S_2$ into a second analog signal $A_2$. The attenuator 18 performs an analog attenuation on the output $A_2$ of the second DAC 14 to produce an attenuated signal $A_2'$, and the summer 16 adds together the first analog signal $A_1$ and the attenuated second analog signal $A_2'$ to produce the overall result $A_0$.

The circuit can be implemented using separate components for each of the digital sample splitter 10, the first and second DACs 12, 14, and the attenuator 18. The digital sample splitter 10 may be a circuit, for example an FPGA, ASIC or other suitable device suitably designed and/or programmed. The DACs 12, 14 and the attenuator 18 may be off-the-shelf components. Alternatively a custom device incorporating combinations of two or more or even all of the functions of the digital sample splitter 10, the first and second DACs 12, 14 and the attenuator 18.

Figure 2:
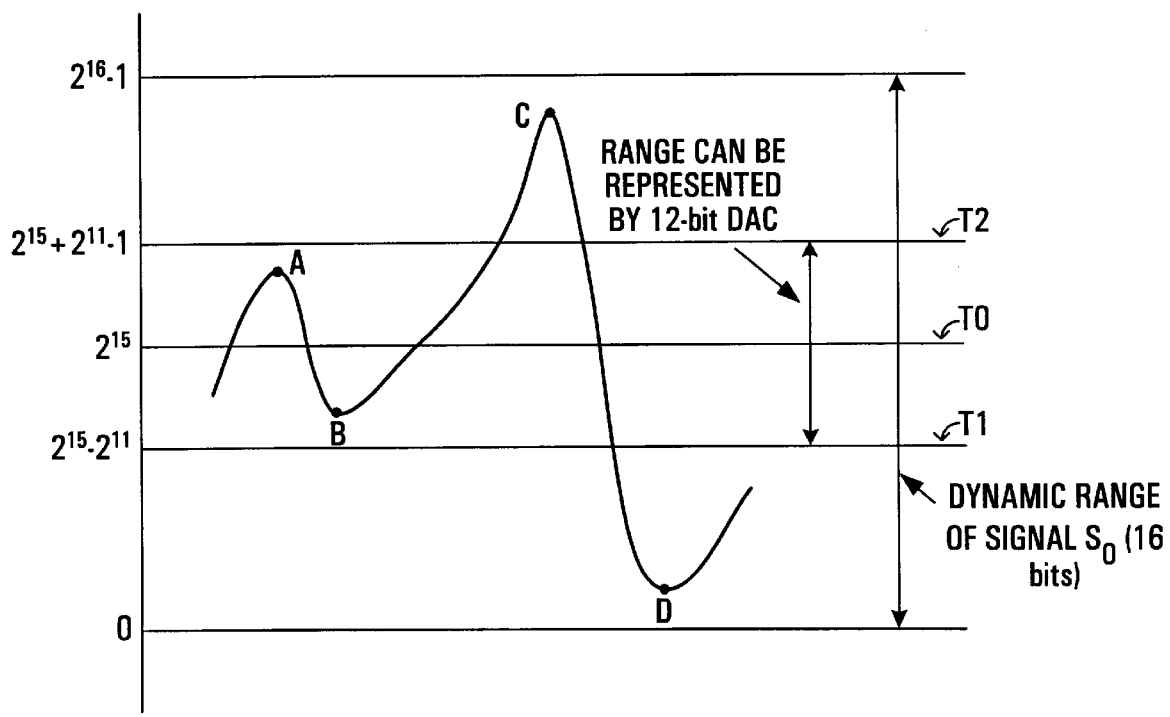
FIGS. 2, 3A, 3B, 4A, 4B, 5A, 5B, 6A, 6B and 7 are plots of various functions at different points in the processing of a sequence of digital samples by the apparatus of FIG. 1.

The stacked digital-to-analog converter will now be described further with an example in which M, the width of the input digital samples, is selected to be 16, and in which N, the sample size for the two DACs 12, 14 is selected to be 12. For the purpose of explanation, an example plot of a series of digital samples is included in FIG. 2. It is assumed that for this example offset binary (or positive binary) is the format of the digital samples, and as such the 16-bit samples can range from 0 (which is the all zeros sample (0000000000000000) to $2^{16}-1$ (which is the all ones sample (1111111111111111). Also indicated in FIG. 2 are three demarcation lines labelled T0, T1 and T2. The first demarcation line T0 is at $2^{15}$. This is the midpoint in the range of values a 16-bit sample can represent. The second and third demarcation lines are selected such that they contain a range of values centred at T0 which are representable by 12-bit samples. Thus $T1=2^{15}-2^{11}$, and $T2=2^{15}+2^{11}-1$ respectively. The range of values which may be within the two demarcation lines is given by $T2-T1=(2^{15}+2^{11}-1)-(2^{15}-2^{11}) = 2^{12}-1$, and this is the range of a 12-bit DAC.

The purpose of the digital sample splitter 10 of FIG. 1 is to represent information falling outside the two thresholds T1 and T2 by the first 12-bit sample $S_1'$, and to represent information falling inside the thresholds T1 and T2 by the second 12-bit sample $S_2$. The processing performed to determine $S_2$ and subsequently to determine the attenuated analog representation $A_2'$ of $S_2$ will now be described. $S_2$ is determined according to the following equations:

$$S_0 > (T2 = 2^{15} + 2^{11} - 1) \to S_2 = 2^{12} - 1$$

$$S_0 < (T1 = 2^{15} - 2^{11}) \to S_2 = 0$$

$$T1 <= S0 <= T2 \to S_2 = S_0 - 2^{15} - 2^{11}.$$

Figure 3A:
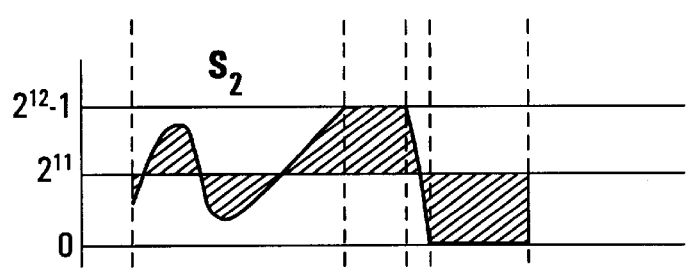
Figure 4A:
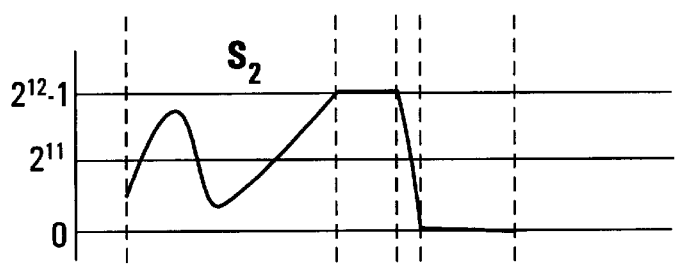
Figure 5A:
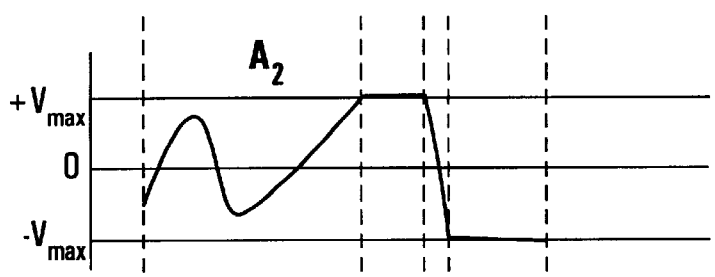
Figure 6A:
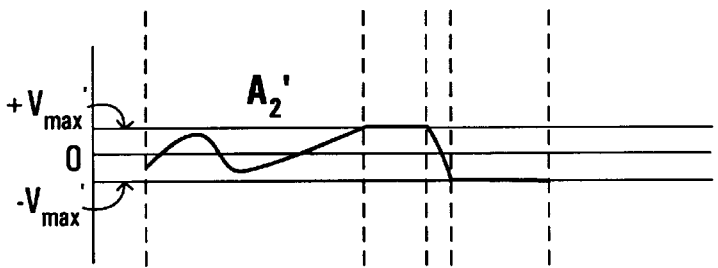

$S_2$ for the example of FIG. 2 is illustrated in FIG. 3A. It can be seen that $S_2$ is basically equivalent to $S_0$ clipped to be in between the T1 and T2, and then shifted to be in the range 0 to $2^{12} - 1$. This value is then processed by the second DAC 14 which has a full scale of $-V_{max}$ to $+V_{max}$ volts to produce an analog signal $A_2$ such as illustrated in FIG. 5A. (Nothing happens in FIG. 4A). It is assumed that the fullscale of the overall output $A_0$ is also to be $-V_{max}$ to $+V_{max}$ volts. The output of the second DAC 14 corresponds to an input in the range 0 to $2^{12} - 1$, while the overall output is to correspond to an input in the range 0 to $2^{16} - 1$, thus, to put the output of the second DAC 14 in the proper scale for consideration as the output of a 16-bit DAC, the output of the second DAC 14 needs to be attenuated by a factor of $\frac{1}{2}^{16-12} = \frac{1}{2}^n = \frac{1}{16}$, where n is the difference between M and N. This may be also be expressed as an attenuation of $10^{-6.0206n/20}$ which can be approximated by $10^{-6n/20}$ which is an attenuation of 6n dB. Attenuating the signal results in a signal within a range $-V_{max}'$ to $V_{max}'$, where $V_{max}' = V_{max} \times 10^{-6.0206n/20}$. The attenuated signal $A_2'$ is illustrated in FIG. 6A.

Turning now to the processing for $S_1'$, $S_1$ is determined according to the following equations:

$$S_0 > (T2 = 2^{15} + 2^{11} - 1) \to S_1 = S_0 - (2^{11} - 1)$$

$$S_0 < (T1 = 2^{15} - 2^{11}) \to S_1 = S_0 + 2^{11}$$

$$T1 < \times S_0 <= T2 \to S_1 = 2^{15}.$$

Figure 3B:
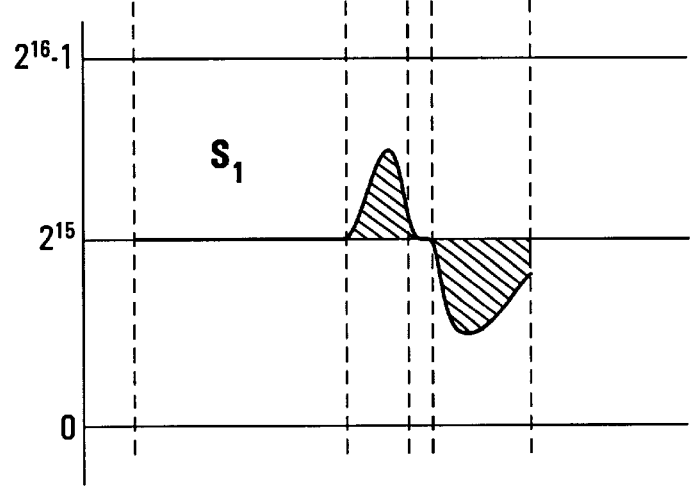
Figure 4B:
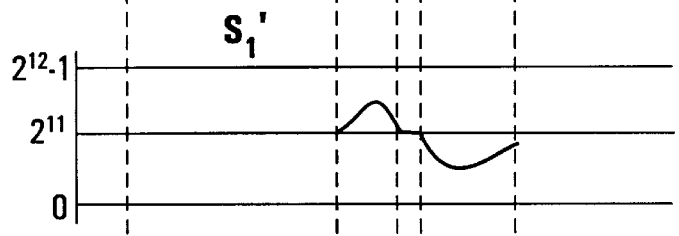

$S_1$ for the above example is illustrated in FIG. 3B. It can be seen that $S_1$ is equivalent to the amount clipped from $S_0$ in creating $S_2$ and shifted so as to be centred at $2^{15}$. This value is then shifted to the left by M–N=n=4 bits resulting in a 12-bit sample $S_1$ ' suitable for processing by a 12-bit DAC. The shifted version of the signal $S_1'$ is illustrated in FIG. 4B. This sample is then processed by the first DAC 12 which has a full scale of $-V_{max}$ to $+V_{max}$ volts to produce an analog signal $A_1$ such as illustrated in FIG. 5B.

Figure 5B:
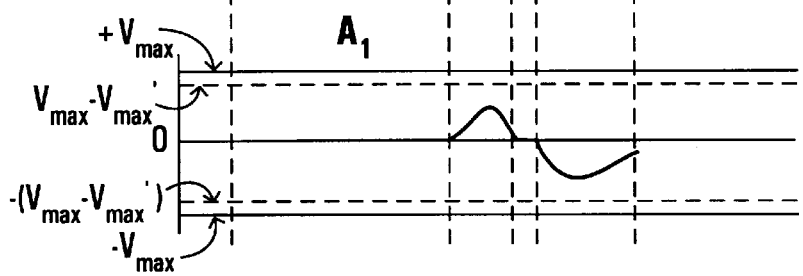
Figure 6B:
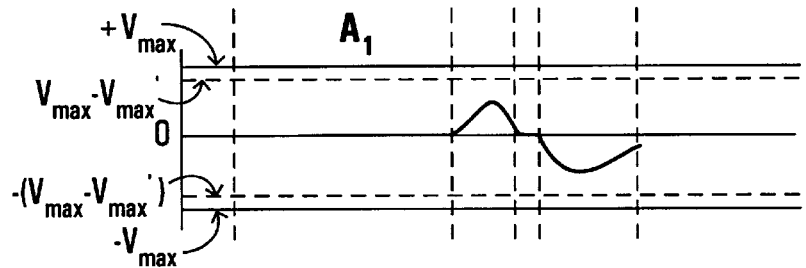

Referring to FIG. 5B, where $S_1$ had a contiguous range of $(2^{11}$ to $2^{16} - 2^{11})$, after the shift, $S_1'$ has a range of $(2^7$ to $2^{12} - 2^7)$. Given that $2^{11}$ yields a converted voltage of 0 in a 12-bit DAC, the largest output which will ever result from the first DAC 12 is the converted voltage for $2^{12} - 2^7$ which is a fraction $15/16$ of DAC's full scale range $V_{max}$. Thus despite the first DAC 12 having a fullscale output of $-V_{max}$ to $+V_{max}$, the actual output of the first DAC for this design will always be in the range $-15/16\ V_{max}$ to $15/16\ V_{max}$. Recalling that $V_{max}' = 1/16\ V_{max}$, the range of $A_1$ can be rewritten as $-(V_{max} - V_{max}')$ to $V_{max} - V_{max}'$ and this range is indicated in FIG. 6B.

Figure 7:
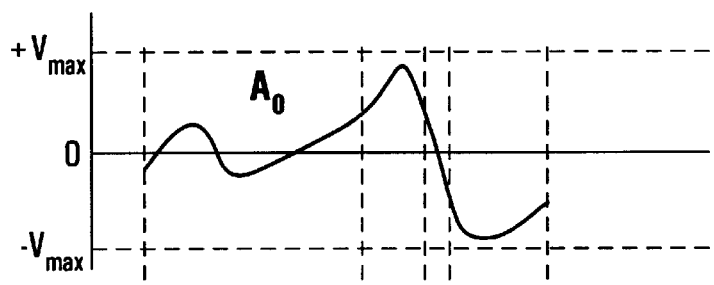

The summer 16 combines the two analog signals $A_1$ and $A_2'$ producing the signal $A_0$ illustrated in FIG. 7. This signal has a range of $-V_{max}$ to $+V_{max}$, this being the sum of the ranges of its two constituent signals. $A_0$ is a true analog representation of the input signal $S_0$.

Performing the digital-to-analog conversion in this manner has significant advantages in terms of noise reduction. To begin, an assumption being made is that most of the transitions in the incoming digital signal $S_0$ will occur within the range T1 to T2, and thus will end up existing in $S_2$. Correspondingly, there are very few transitions in $S_1$. This has the effect of reducing substantially the noise floor in $S_1$, while the noise floor for $S_2$ will be similar to that of the original signal $S_0$. However, $S_2$, after conversion to $A_2$, is passed through an attenuator which attenuates both $A_2$ and its noise, resulting in a noise floor which is attenuated by 6n dB, 24 dB in the specific example given above. Then, when adding $A_1$ to $A_2'$, a signal with a very low noise floor results, which may be as much as 6n dB lower than that of a conventional design. This translates directly into a 6n dB improvement in the SFDR.

A very specific implementation/embodiment of the invention has been described for the case where 16-bit samples are split into two 12-bit samples which are then processed separately until their resulting analog values are summed. It is to be understood that the invention has a much more general application than this. This more general application will be described below with reference to a flowchart in FIG. 8, and how the above specific example fits in with the general application will be described.

More generally, the desired analog fullscale of the stacked M-bit ($M \geq 2$, preferably $\geq 4$, and more preferably $\geq 8$) digital-to-analog converter can be defined to have a plurality K of subranges which need not necessarily be contiguous, K being at least two. In preferred embodiments k=2,3 and 4 respectively. In the example given above, there were two (K=2) subranges consisting firstly of $(-V_{max}$ to $-V_{max}' + V_{max}', V_{max} - V_{max}'$ to $V_{max})$ and secondly of $(-V_{max}'$ to $V_{max}')$. Next, a corresponding digital subrange of 0 to $2^M - 1$ is defined for each analog subrange. In the example given above, the corresponding digital subrange for $(-V_{max}$ to $-V_{max}' + V_{max}', V_{max} - V_{max}'$ to $V_{max}$) was (0 to $2^{15} - 2^{11} - 1$, $2^{15} + 2^{11}$ to $2^{16} - 1$) and the corresponding digital subrange for $(-V_{max}'$ to $V_{max}')$ was $(2^{15} - 2^{11}$ to $2^{15} + 2^{11} - 1)$. Having defined the various analog and digital subranges, in step 8-A each M-bit digital sample is converted into K digital samples each having a respective sample size $N_k$, k=1,...,K one for each subrange, ($N_k < M$, $N_k \geq 1$, preferably $\geq 2$ and more preferably $\geq 4$). In the example given above, M=16, and $N_1 = 12$ and $N_2 = 12$. Preferably, $N_k$, k=1,...,K are equal in size, but this need not necessarily be the case. Preferably, the ranges are selected so that they are centred at the midrange of the overall device, i.e., the analog ranges are selected to be centred at 0, and the digital ranges are centred at $2^{M-1}$. This is the case for the example given above. The steps involved in this conversion may involve one or more of subtraction, addition, clipping, bit shifting.

Next, in step 8-B a respective digital-to-analog converter performs a digital-to-analog conversion on each of the K digital samples to produce a respective analog signal. In the example given above, this resulted in the two analog signals $A_1$ and $A_2$.

Next, in step 8-C a respective attenuation is applied to each of the analog signals so as to result in an analog signal having a dynamic range equal to the analog subrange corresponding with the analog signal's digital sample's digital subrange. In the example above, the dynamic range of the first analog signal $A_1$ was correct, and so no attenuation was applied (or an attenuation of 0 dB was applied). The dynamic range of the second analog signal $A_2$ was too large, and an attenuation of 24 dB was applied.

As indicated at step 8-D, in the event that a given range was not centred at the midrange of the overall device as preferred, the analog signal needs to be DC offset such that it is in the correct location. This ensures that it makes sense to add all of the attenuated values directly together. For example, if a range of $(2_{15}$ to $2_{15}+2_{12}-1)$ was selected for a particular sample, this needs to produce an analog signal in the range of 0 to $2V_{max}'$. However, the DAC will produce a signal in the range of $-V_{max}$ to $+V_{max}$. Thus, it needs to be offset by $V_{max}$ so as to be in the range of 0 to $2V_{max}$. When attenuated, 0 to $2V_{max}$ will become 0 to $2V_{max}'$ as required. More generally, each analog signal must be offset and/or attenuated such that will have a range equal in size and position to its desired corresponding analog range.

Finally, in step 8-E the overall result is determined by adding together all of the attenuated analog signals.

Figure 8:
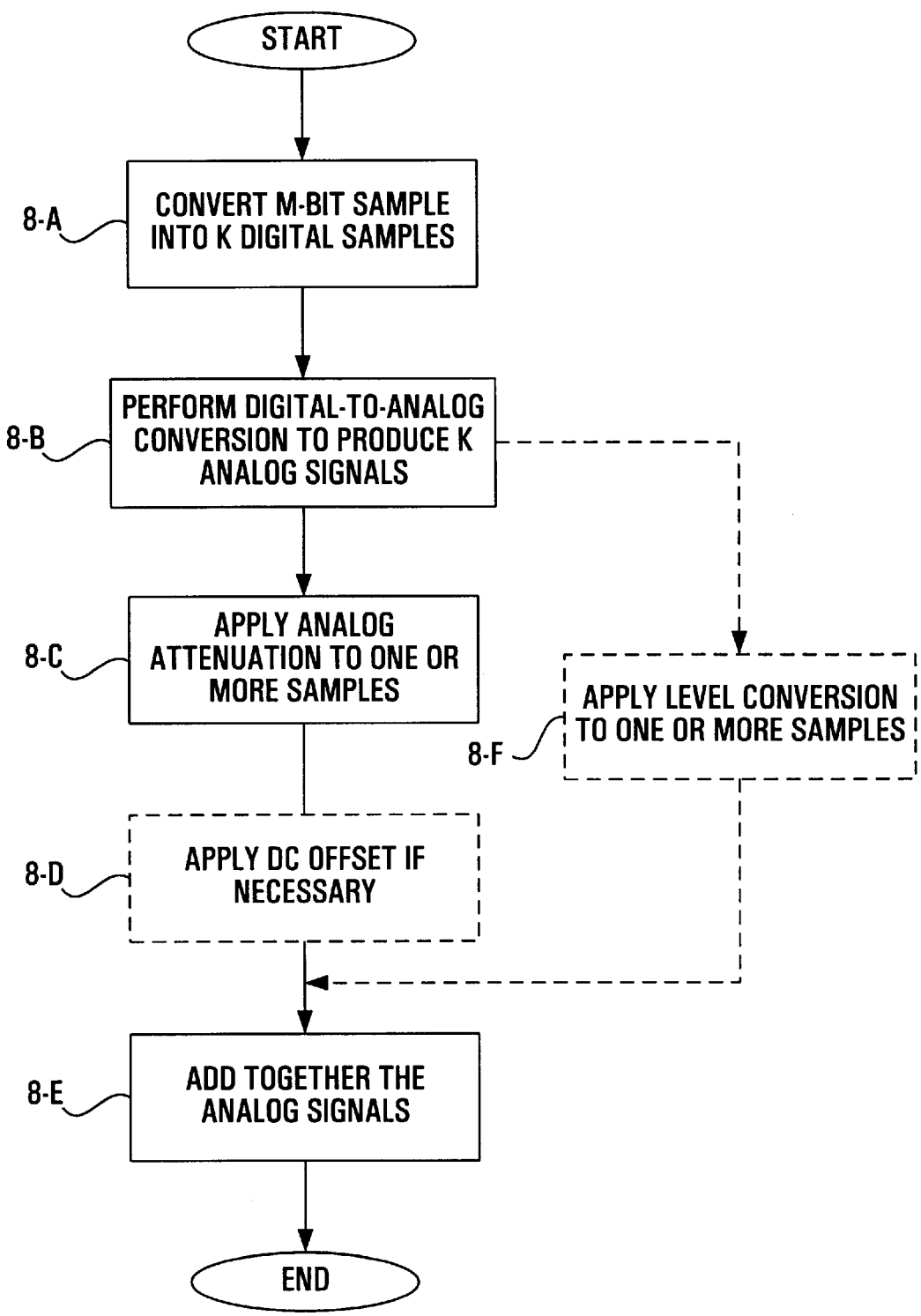
FIG. 8 is a flowchart for a method of performing digital-to-analog conversion according to an embodiment of the invention.

The required DC offset can be achieved by adding a constant value to the output of the DAC before attenuation. Equivalently, after attenuation an appropriate (different) DC offset may be applied to the same effect. In this particular example, offsetting by $V_{max}'$ after attenuation will produce the same result. Overall, the attenuation and offsetting must collectively be done in any manner such that the required analog range results. Circuitry which can perform the required combination of attenuation and offsetting will be referred to as level conversion circuitry. In FIG. 8, the step 8-F of applying level conversion to one or more samples can be performed in place of steps of 8-C and 8-D.

Furthermore, where the examples have all assumed an attenuation is required, more generally some sort of gain adjustment may be required. For example, the overall output may have a desired dynamic range which is larger than that of the DACs in which case gains might be required on the DAC outputs.

Numerous modifications and variations of the present invention are possible in light of the above teachings. It is therefore to be understood that within the scope of the appended claims, the invention may be practised otherwise than as specifically described herein.

Where the above described examples have assumed binary offset formatted samples, other sample formats could be alternatively used assuming the appropriate adjustments in the splitter function are made.

The embodiments of the invention in which an exclusive property or privilege is claimed are defined as follows:

1. An apparatus comprising:
    a digital sample splitter for splitting an incoming M-bit sample into first and second N-bit samples, where M>=2, N>=1, and M>N, the first N-bit sample containing information relating to the M-bit sample when outside a first predetermined range, and the second N-bit sample containing information relating to the M-bit sample when inside said first predetermined range;
    a first DAC for processing the first N-bit sample to produce a first analog signal;
    a second DAC for processing the second N-bit sample to produce a second analog signal;
    an attenuator for attenuating the second analog signal to produce a third analog signal; and
    a summer for adding the first analog signal to the third analog signal representative of the M-bit sample.

2. An apparatus according to claim 1 wherein $M \geq 4$ and $N \geq 4$.

3. An apparatus according to claim 2 wherein:
    said second predetermined range is a range having a size equal to the range of the second N-bit DAC which is centred at the midpoint of the range the M-bit sample.

4. An apparatus according to claim 3 wherein the attenuator applies an attenuation to the second analog signal such that it has a dynamic range equal to a fraction of the total dynamic range of the apparatus which is substantially equal $\frac{1}{2}^{M-N}$.

5. An apparatus according to claim 2 wherein the digital sample splitter comprises functionality to generate first and second samples such that:
    the first sample is the M-bit sample clipped and shifted to have a range of 0 to $2^N-1$;
    the second sample is the amount clipped from the M-bit sample in creating the first sample, shifted to have a range centred about $2^{N-1}$.

6. An apparatus according to claim 5 wherein:
    M=16, N=12;
    the second sample is defined by:

$$S_0>(T2=2^{15}+2^{11}-1) -> S_2=2^{12}-1$$

$$S_0<(T1=2^{15}-2^{11}) -> S_2=0$$

$$T1<=S_0<=T2 -> S_2=S_0-2^{15}-2^{11},$$

the first sample is defined by:

$$S_0>(T2=2^{15}+2^{11}-1) -> S_1=S_0-(2^{11}-1)$$

$$S_0<(T1=2^{15}-2^{11}) -> S_1=S_0+2^{11}$$

$$T1<=S_0<=T2$$

where $S_0$ is the M-bit sample, the first sample is $S_1$ shifted left by four bits, the second sample is $S_2$; and
an attenuation substantially equal to multiplication by a fraction $\frac{1}{16}$ is applied to the second analog signal.

7. An apparatus according to claim 5 wherein:
the second sample is defined by:

$$S_0>(T2=2^{M-1}+2^{N-1}-1) -> S_2=2^{N-1}-1$$

$$S_0<(T1=2^{M-31\ 1}-2^{N-1}) -> S_2=0$$

$$T1<=S_0<=T2 -> S_2=S_0-2^{M-1}-2^{N-1},$$

the first sample is defined by:

$$S_0>(T2=2^{M-1}+2^{N-1}-1) -> S_1=S_0-(2^{N-1}-1)$$

$$S_0<(T1=2^{M-31\ 1}-2^{N-31\ 1}) -> S_1=S_0+S^{N-1}$$

$$T1<=S_0<=T2 -> S_1=2^{M-1},$$

where $S_0$ is the M-bit sample, the first sample is $S_1$ shifted left by four bits, the second sample is $S_2$; and
an attenuation substantially equal to multiplication by a fraction $1/(2^{M-N})$ is applied to the second analog signal.

8. An apparatus according to claim 1 adapted to handle offset binary samples.

9. An apparatus according to claim 7 adapted to handle offset binary samples.

10. A method of performing digital-to-analog conversion on M-bit samples to produce an analog signal having a fullscale comprising:
    defining the fullscale to have a plurality K of analog subranges, where K>=2;
    defining for each analog subrange a corresponding digital subrange of 0 to $2^M-1$;
    converting an M-bit digital sample into K digital samples, one for each subrange;
    performing a digital-to-analog conversion on each of said K digital samples to produce a respective analog signal;

applying a respective gain adjustment to each of said analog signals so as to result in an analog signal having a dynamic range equal to the analog subrange corresponding with the analog signal's digital sample's digital subrange; and adding together all of the gain adjusted analog signals.

11. A method according to claim 10 wherein all of the analog ranges are centred about the midpoint of the fullscale, and all of the digital ranges are correspondingly centred about the midpoint of the range of M-bit samples.

12. A method according to claim 10 further comprising:

offsetting each analog signal by an amount such that when gain adjusted, it will have a range equal in size and position to its corresponding analog range.

13. A digital-to-analog converting apparatus for performing a digital-to-analog conversion on M-bit samples to produce an analog signal having a fullscale, the apparatus comprising:

digital sample splitting circuitry for converting an M-bit digital sample into K digital samples, one for each of a plurality K of digital subranges of 0 to $2^M-1$, where k is an integer $\geq 2$.

K digital-to-analog converters, for performing a digital-to-analog conversion on each of said K digital samples to produce a respective analog signal;

gain adjustment circuitry for applying a respective gain adjustment to at least one of said analog signals so as to result in each analog signal having a respective dynamic range equal to an analog subrange of the fullscale which corresponds with the analog signal's digital sample's digital subrange; and adding circuitry for adding together all of the gain adjusted analog signals.

14. An apparatus according to claim 13 wherein all of the analog ranges are centred about the midpoint of the fullscale, and all of the digital ranges are correspondingly centred about the midpoint of the range of M-bit samples.

15. An apparatus according to claim 13 further comprising:

DC offsetting circuitry for applying a DC offset to each analog signal by an amount such that when gain adjusted, it will have a range equal in size and position to its corresponding analog range.

16. An apparatus according to claim 13 wherein k=2.

17. An apparatus according to claim 13 wherein k=3.

18. An apparatus according to claim 13 wherein k=4.

19. A digital-to-analog converting apparatus comprising:

digital sample splitting means for producing K digital samples from an input M-bit sample, one for each of a plurality K of digital subranges of 0 to $2^M-1$;

digital-to-analog conversion means for performing a digital-to-analog conversion on each of said K digital samples to produce a respective analog signal; and level-conversion means for converting a respective analog range of each analog signal to another respective analog range which is in correspondence with the analog signal's respective digital sample's digital subrange.

20. An apparatus according to claim 19 adapted to handle offset binary digital samples.

* * * * *